United States Patent [19]
Takiar et al.

[11] Patent Number: 5,502,289
[45] Date of Patent: Mar. 26, 1996

[54] STACKED MULTI-CHIP MODULES AND METHOD OF MANUFACTURING

[75] Inventors: Hem P. Takiar, Fremont; Peng-Cheng Lin, Cupertino, both of Calif.

[73] Assignee: National Semiconductor Corporation, Santa Clara, Calif.

[21] Appl. No.: 403,061

[22] Filed: Mar. 13, 1995

Related U.S. Application Data

[62] Division of Ser. No. 887,774, May 22, 1992, Pat. No. 5,422,435.

[51] Int. Cl.$^6$ ................................................. H05K 1/00
[52] U.S. Cl. ........................... 174/266; 174/260; 174/261; 174/262; 361/790; 361/789; 361/783; 361/784; 257/666; 439/65; 439/69; 439/74
[58] Field of Search ................................. 361/790, 789, 361/784, 776, 778, 760, 783; 174/260, 262, 266, 261, 255; 257/666, 676; 439/65, 68, 69, 70, 71, 74

[56] References Cited

U.S. PATENT DOCUMENTS

| | | | |
|---|---|---|---|
| 4,296,456 | 10/1981 | Reid | 361/403 |
| 4,320,438 | 3/1982 | Ibrahim et al. | 361/401 |
| 4,714,952 | 12/1987 | Takekawa et al. | 357/75 |
| 5,012,323 | 4/1991 | Farnworth | 357/75 |
| 5,294,826 | 5/1994 | Marcantonio et al. | 257/659 |

FOREIGN PATENT DOCUMENTS

| | | | |
|---|---|---|---|
| 56-55067 | 5/1981 | Japan | H01L 23/52 |
| 63-70532 | 3/1988 | Japan | H01L 21/60 |
| 1-28856 | 1/1989 | Japan | H01L 27/00 |
| 1-235363 | 9/1989 | Japan | H01L 25/08 |
| 3-165550 | 7/1991 | Japan | H01L 25/065 |
| 3-225932 | 10/1991 | Japan | H01L 21/60 |

OTHER PUBLICATIONS

"Matsushita's Stacked Chip Module," Semiconductor Packaging Update, vol. 4, No. 5, pp. 9, 1989.
Stuart N. Shanken and John C. Carson, "Very High Density 3-D Packaging of Integrated Circuits," ISHM 1989 Proceedings, Baltimore, Maryland, pp. 1–7.
Takaashi Oksaki, "Electronic Packaging in the 90s—A Perspective from Asia," IEEE, 40th Electron, Components and Technology Conference, vol. 1, May 20–23, Las Vegas, NV, 1990, pp. 1–8.
Rao R. Tummala, "Electronic Packaging in the 90s—A Perspective from America," IEEE, 40th Electron, Components and Technology Conference, vol. 1, May 20–23, Las Vegas, NV, 1990, pp. 9–15.
H. Wessely et al., "Electronic Packaging in the 90s—A Perspective from Europe," IEEE, 40th Electron, Components and Technology Conference, vol. 1, May 20–23, Las Vegas, NV, pp. 16–33.
John C. Carson and Stuart N. Shanken, "High Volume Producibility and Manufacturing of Z–Plane Technology," SPIE, Material, Devices, Techniques and Applications for Z–Plane Focal Plane Array, (FPA) Technology, vol. 1097, 1989, pp. 138–149.
Myles F. Suer and John C. Carson, "Future Capabilities of Z–Plane Technology," SPIE, Materials, Devices, Techniques, and Applications for Z–Plane Focal Plane Array (FPA) Technology, vol. 1097, 1989, pp. 41–49.

*Primary Examiner*—Laura Thomas
*Attorney, Agent, or Firm*—Limbach & Limbach

[57] ABSTRACT

A circuit assembly which includes a semiconductor die having substantially parallel opposing first and second surfaces and at least one electrical contact mounted on the first surface. A first element having substantially parallel opposing first and second surfaces and at least one electrical contact mounted on one of its surfaces is mounted on and at least partially supported at its second surface by the first surface of the semiconductor die. The first element is positioned such that the semiconductor die electrical contact is exposed. A fine wire conductor having first and second ends is connected at its first end to either the semiconductor die electrical contact or the first element electrical contact. A method of manufacturing this circuit assembly is also disclosed.

4 Claims, 8 Drawing Sheets

STACKED MULTI-CHIP MODULES AND METHOD OF MANUFACTURING

This is a divisional of application Ser. No. 07/887,774, filed May 22, 1992, now Pat. No. 5,422,435.

BACKGROUND OF THE INVENTION

1. Field of the Invention

The present invention relates to semiconductor packaging technologies, and more particularly, to semiconductor packages which contain multiple semiconductor dice and/or substrates.

2. Description of the Related Art

Very Large Scale Integrated (VLSI) semiconductor dice are usually housed in semiconductor packages. Normally, one semiconductor package contains only one die.

There are three conventional types of semiconductor packages. Molded plastic packages contain a lead frame molded within a plastic body. A lead frame is a sheet metal framework having several electrical leads and a Die Attach Pad (DAP) serving as a principal mounting surface (or seating plane) upon which a die is mounted. The die may be bonded either directly to the DAP or to a substrate attached to the DAP. The electrical leads provide an electrical path from inside the molded plastic to outside the plastic. Some common types of molded plastic packages are: Plastic Chip Carrier (PCC), Molded Dual Inline Package (MDIP), Plastic Quad Flat Pack (PQFP), Small Outline (SO), Shrink Small Outline Package (SSOP), Transistor Outline Package (TO), Very Small Outline Package (VSOP), and Thin Small Outline Package (TSOP).

The second conventional type of semiconductor package is the cavity package. In the cavity package, a cavity base which serves as a principal mounting surface (or seating plane) upon which a die is mounted is contained within a hollow housing. Unlike the molded plastic package, the die in a cavity package is surrounded by air. Several electrical leads provide an electrical path from inside the housing to outside the housing. Some common types of cavity packages are ceramic packages, metal cans, plastic packages, and any combination thereof.

The third conventional type of semiconductor configuration is the Chip-On-Board (COB) assembly. In the COB, a die is directly bonded to a circuit board or substrate which serves as a principal mounting surface (or seating plane). The die is usually covered and protected with a plastic material. A variety of different types of electrical leads may be employed to provide an electrical path from inside the plastic material to outside the plastic material.

Although the three conventional types of semiconductor packages have various different shapes and sizes, each of them includes several electrical leads and a principal mounting surface (or seating plane) upon which a die is mounted.

A common method of making electrical connections between the die and the electrical leads, which is used in each of the three conventional types of packages, is wire bonding. Wire bonding is a method of making electrical interconnections among components in a discrete package by means of fine wire conductors welded to the individual components. Thus, a fine wire conductor has one end connected to an electrical lead and the other end connected to an electrical contact on the die. Wire bonding is a popular method of interconnecting dice. Improvements in capillary design, wire bonding process control, and wire properties have allowed finer pitch bonding to be made.

Often two or more semiconductor dice are electrically interconnected to provide a single circuit assembly. Under the one die per package paradigm, the interconnection of two or more dice requires enough physical space for an equal number of packages. In order to decrease size and weight, as well as improve device performance, there have been several attempts to combine two or more dice into a single package. In the high density integrated circuit packaging industry, the combination of two or more dice in a single package is typically referred to as a Multi-Chip Module (MCM) or Multi-Chip Package (MCP). Although the terms Multi-Chip Module and Multi-Chip Package have slightly different meanings, for purposes of this discussion, they may be used interchangeably.

The most common MCM is the "side-by-side" MCM. In this version two or more dice are mounted next to each other (or side by side each other) on the principal mounting surface of either a plastic molded package, cavity package, or COB package. The die may be mounted directly to the principal mounting surface or it may be mounted on a substrate material which is itself mounted directly to the principal mounting surface. Interconnections among the dice and electrical leads are commonly made via wire bonding.

The side-by-side MCM, however, suffers from a number of disadvantages. Laying out the dice side by side on the principal mounting surface within a molded plastic package or a cavity package is not the most optimal way to use package real estate. Such real estate is preciously limited since, in most cases, the dice have to fit within some standard form factor previously designed for only one die. If the dice are not properly laid out, the real estate restriction will limit the number of dice that can be incorporated into the MCM. Furthermore, unoptimized dice layout yields correspondingly unoptimized wire bonding resulting in wire cross over, long wire lengths and small wire-to-wire separation. Wire cross over, where one wire loops over another wire, is highly undesirable because shorting may occur as a result of molding conditions. Similarly, long wire lengths and small wire-to-wire separation can pose high risks for wire sweep under fast mold transfer conditions or high resin viscosity.

Other attempts at building MCMs have involved placing two or more dice on top of one another and then securing the "stack" of dice in a package. Currently available stacked MCMs are fabricated by stacking entire wafers and then sawing the stacked wafers into stacked dice. Thus, each of the individual die in a particular stack is the same size.

One disadvantage of currently available stacked MCMs is that they are all memory devices; it is believed that no mixed technology devices are currently available in stacked form. Another disadvantage of currently available stacked MCMs is that they require unique and specialized packages. Furthermore, complex and expensive methods are used to make electrical interconnections among the dice; the methods of interconnection currently used are Controlled Collapse Chip Connection (C4) and Tape Automated Bonding (TAB).

Controlled Collapse Chip Connection (C4), also known as "flip chip" involves the use of a large number of solder bumps on a die surface which allow it to be bonded face down. Among the advantages are improved thermal performance, electrical characteristics and reworkability. On the other hand, commonly acknowledged disadvantages include requirements for precise alignment, difficulties in cleaning and inspection, uniform solder joint height for all connections to be made and a substrate with low coefficient of thermal expansion for longer thermal cycle life. Furthermore, in order to use C4, all solder bumps and interconnections must be implemented before and during the stacking of the dice; in other words, after the dice are stacked, no additional interconnections can be made.

Tape Automated Bonding (TAB) refers to a process whereby dice are joined by patterned metal on polymeric tape using thermocompression bonding. Subsequent attachment to a substrate or board is carried out by outer lead bonding. Tape Automated Bonding (TAB) has seen only limited application to MCMs. Although TAB possesses many advantages, barriers to its wide usage include the high starting cost of custom tape, the moisture sensitivity of polyimide tape and the need to switch to single point bonding with large dies to circumvent planarity issues.

Thus, there is a need for a low cost MCM which overcomes the disadvantages of currently available MCMs.

SUMMARY OF THE INVENTION

The present invention provides a circuit assembly having a semiconductor die which has substantially parallel opposing first and second surfaces and at least one electrical contact mounted on the first surface. A first element having substantially parallel opposing first and second surfaces and at least one electrical contact mounted on one of its surfaces is mounted on and at least partially supported at its second surface by the first surface of the semiconductor die. The first element is positioned such that the semiconductor die electrical contact is exposed. A fine wire conductor having first and second ends is connected at its first end to either the semiconductor die electrical contact or the first element electrical contact.

A method of manufacturing the above circuit assembly includes the steps of dispensing the semiconductor die onto a carrier member having a principal mounting surface and a plurality of electrical leads. The semiconductor die should be at least partially supported at its second surface by the principal mounting surface. The first element is then dispensed onto the semiconductor die first surface. The first element should be at least partially supported at its second surface by the semiconductor die, and the first element should be positioned such that the semiconductor die electrical contact is exposed.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE PREFERRED EMBODIMENT

Figure 1:
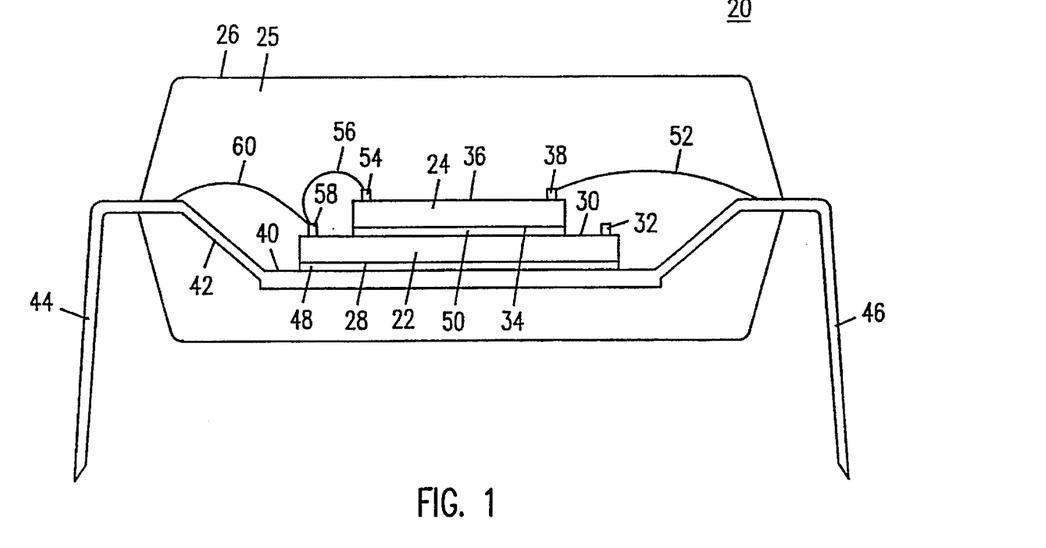
FIG. 1 is a cross-sectional view of a multi-chip module in accordance with the present invention.

FIG. 1 illustrates one embodiment of a multi-chip module 20 in accordance with the present invention. The module 20, or simply, the circuit assembly 20, includes a first element 24 which is "stacked" on a semiconductor die 22. The semiconductor die 22 has substantially parallel opposing first and second surfaces 30 and 28 with at least one electrical contact 32 being mounted on the first surface 30. The first element 24 also has substantially parallel opposing first and second surfaces 36 and 34 with at least one electrical contact 38 being mounted on either the first or second surface 36 or 34. In the embodiment shown in FIG. 1, the electrical contact 38 is shown mounted on the first surface 36.

The first element 24 may be a semiconductor die or a substrate material. If the first element 24 is a substrate material, then it may be used as an interconnect media (discussed below). The substrate material may be, but is not limited to, ceramic, metal, silicon, or a plastic circuit board (PCB) material. Due its convenience and ready availability, a multilayer ceramic (MLC) substrate is quite popular. Metal substrates offer other advantages of toughness (compared to MLC), high strength, inexpensive, and high thermal conductivity. With the proper combination of metal layers, such as Copper-Invar-Copper or Copper-Molybdenum-Copper, thermal mismatch between thin polymer films and the substrate can be minimized. Some typical base metals include aluminum, copper, copper/molybdenum, copper/tungsten, Invar, and Kovar. Copper is one of the dominant base metals due to its high thermal conductivity, which tends to minimize thermal stresses. Silicon substrates have the advantages of ready applicability of integrated circuit (IC) manufacturing techniques, possible incorporation of both active and passive devices, good thermal match with other silicon ICs attached to the substrate, and the dielectric layers can be either polyimide or $SiO_2$, both of which are standard dielectrics in IC fabrication. On the other hand, the main disadvantages of silicon substrates are that they are expensive, the size is limited to wafer sizes, and silicon has a lower thermal conductivity than metal substrates.

The semiconductor die 22 may be mounted on a carrier member 42 and at least partially supported by a principal mounting surface (or seating plane) 40 of the carrier member 42. The phrase "mounted on a carrier member 42" is intended to mean that a particular element (in this case the die 22) is either directly attached to the carrier member 42, or that the particular element is attached to some other structure or combination of structures, such as another element, stack of elements, or adhesive materials, which are themselves directly attached to the carrier member 42.

The carrier member 42 generally includes two or more electrical leads 44 and 46. In the embodiment shown in FIG. 1, the carrier member 42 is a lead frame, and the principal mounting surface 40 is a Die Attach Pad (DAP) of the lead frame 42. The electrical leads 44 and 46 are the leads of the lead frame 42. The lead frame 42 is housed within a mold compound 25 of a conventional molded plastic Dual Inline Package (DIP) 26.

One advantage of the present invention is that any of the three conventional semiconductor packages discussed above, i.e., molded plastic packages, cavity packages, and Chip-On-Board (COB) packages, may be used to house the stacked element and die 24 and 22. Furthermore, any other package having a principal mounting surface and electrical leads may also be used to house the stack. The use of conventional packages reduces cost and permits the multi-chip modules to be used immediately in existing electrical systems with little or no modification of the system. Thus, while a DIP is shown in FIG. 1, it should be well understood that the stacked Multi-Chip Modules of the present invention may be housed in virtually any semiconductor package.

The semiconductor die 22 may be mounted to the principal mounting surface 40 by way of an adhesive material 48. The adhesive material 48 may be an epoxy adhesive, soft solder, or any other adhesive suitable for mounting a die to a substrate. The adhesive material 48 may be either electrically conductive or non-conductive. Conductivity is dictated by the type of fillers incorporated into the glue. For instance, metal fillers provide good electrical and thermal dissipation, while inorganic fillers such as fused silica or diamond enhance mainly the thermal performance. An example of an adhesive that works particularly well for ceramic packages is part number 11 Staystik, manufactured by Staystik of Santa Ana, Calif. An example of an adhesive having aluminum nitride for high thermal conductivity for plastic packages is part number 282 Staystik.

The first element 24 is also mounted to the carrier member 42. The first element 24 is mounted such that it is at least partially supported at its second surface 34 by the first surface 30 of the die 22. Furthermore, the first element 24 is positioned such that the electrical contact 32 of the die 22 is exposed and is accessible for making electrical connections thereto. While the first element 24 shown in FIG. 1 is fully supported by the die 22, there are other embodiments of the present invention (discussed below) wherein a second element, along with the die 22, partially supports the first element 24.

The first element 24 may be mounted to the carrier member 42 by way of an adhesive material 50 applied to the first surface 30 of the die 22 and the second surface 34 of the first element 24. The adhesive 50 may also be a conductive or nonconductive adhesive. The Staystik adhesives mentioned above also work particularly well here.

Wire bonding is used to make electrical interconnections between the electrical contacts 32 and 58 of the die 22, the electrical contacts 38 and 54 of the first element 24, and the electrical leads 44 and 46. Because wire bonding is used to make the electrical interconnections among the die and other elements in the stack, the die and other elements should be stacked and positioned in such a manner that at least one of the electrical contacts of either the die and/or other elements is exposed and accessible for making fine wire connections thereto. As shown in FIG. 1, the first element 24 is smaller than the die 22, and thus, when the first element 24 is stacked in the center of the die 22, the electrical contacts 32 and 58 of the die 22 are exposed. However, the first element 24 does not have to be smaller than the die 22; the first element 24 may be the same size, or even larger than the die 22, provided that the first element 24 is positioned on the die 22 in such a manner that at least one of the electrical contacts 32 or 58 is exposed and accessible for making fine wire connections thereto. As will be discussed below, there may even be a hole or slot through the first element 24 which exposes at least one of the electrical contacts of the die 22.

The particular interconnections which are made using the wire bonding method may vary and depend upon the particular application for which the multi-chip module 20 is to be used. For example, the electrical contact 38 of the first element 24 may be coupled to the electrical lead 46 by a fine wire conductor 52 which directly connects the contact 38 to the lead 46. An electrical contact may also be indirectly coupled to a lead using wire bonding. For example, the electrical contact 54 may be coupled to the lead 44 by a fine wire conductor 56 connecting the contact 54 to a contact 58, and then another fine wire conductor 60 connecting the contact 58 to the lead 44.

Figure 2:
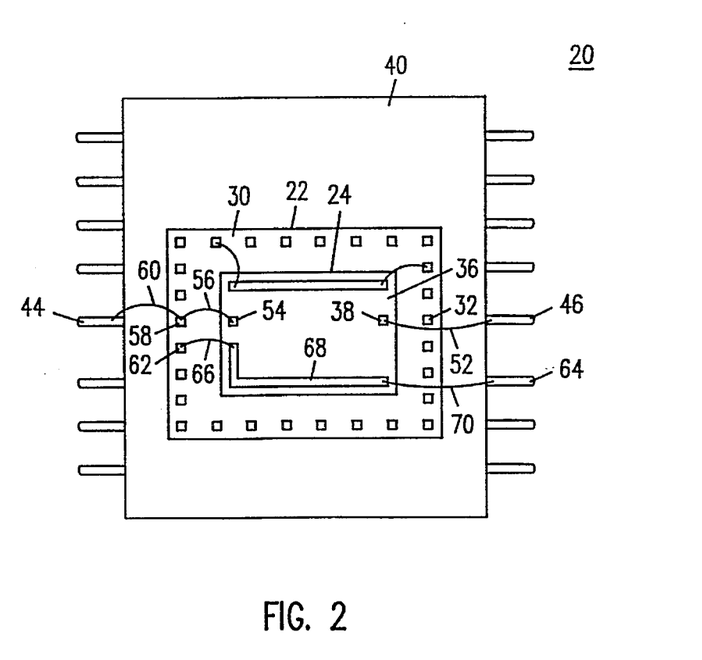
FIG. 2 is a top view of the multi-chip module of FIG. 1.

FIG. 2 illustrates the use of the first element 24 as an interconnect media, i.e., a surface where various long distance interconnections and line routing may be made. When an element is used as an interconnect media it is formed from one of the substrate materials discussed above. An example of a long distance interconnection is the use of an electrical "strip" contact 68 to couple electrical contact 62 to lead 64. Specifically, a fine wire conductor 66 is used to connect contact 62 to one end of strip contact 68. Another fine wire conductor 70 is used to connect the other end of strip contact 68 to lead 64. Thus, when the first element 24 is used as an interconnect media it may contain long strip contacts, similar to a printed circuit board, for transferring electrical signals from one side of the circuit assembly 20 to the other. Again, the particular interconnections which are made will vary and depend upon the particular application for which the multi-chip module 20 is to be used. Furthermore, while FIG. 2 illustrates the use of the first element 24 as an interconnect media, it should be understood that the first element 24 can alternatively be a semiconductor die, in which case similar interconnections from one die to the other may be made.

The stacked configuration illustrates that expansion and layout in the third dimension (as opposed to the side-by-side layout).can increase the density of the MCM significantly. For the same amount of space, a larger number of dice can be housed in a stacked MCM which increases performance, power and versatility of the MCM. The dice or substrates may be progressively smaller in size in the stacking order so that the bond pads can be exposed and accessed; however, progressively smaller sizing is not required as mentioned above.

Different variations of the stacking structure can be implemented in order to optimize the utilization of the third dimension. Dice may be placed on top of each other, each attached to the other by either a non-conductive die attach or a thermoplastic tape fitting the footprint of the top die. The number of dice which can be contained in one stack might be limited by the cavity height within a ceramic package or by the thickness of a molded plastic package.

Substrates can be stacked with the dice to provide an interconnect media and a line routing means between the dice which helps to eliminate long wire bond lengths. A substrate placed on top of another die does not have to cover the whole die surface. It can also be used as an intermediate means of routing wiring to another die placed side by side the substrate.

By using the proper layout of dice or dice/substrate combinations, wire bonding can be achieved with no wire cross over and acceptable levels of wire-to-wire separation. Furthermore, stacking dice can provide configurations having wire bond lengths meeting standard assembly specifications. Maintaining short wire bond lengths minimizes the potential for wire sweep in the molding of the MCM.

The embodiment of the present invention shown in FIGS. 1 and 2 illustrates a stacked MCM having only two elements, i.e., a die 22 and a die or substrate 24. However, there is no limitation on the number of elements which can be stacked. The present invention encompasses the stacking of any number of elements where at least one of the elements in the stack is a semiconductor die having at least one other element on top of the die, and where the elements are stacked in such a manner that at least one electrical contact of at least one element is exposed and accessible for making wire bonding connections thereto. Note that some of the elements in the stack may be interconnected by using Controlled Collapse Chip Connection (C4), or "flip chip" connection, provided that the elements are stacked in such a manner that at least one electrical contact of at least one element is exposed and accessible for making wire bonding connections thereto.

Figure 3:
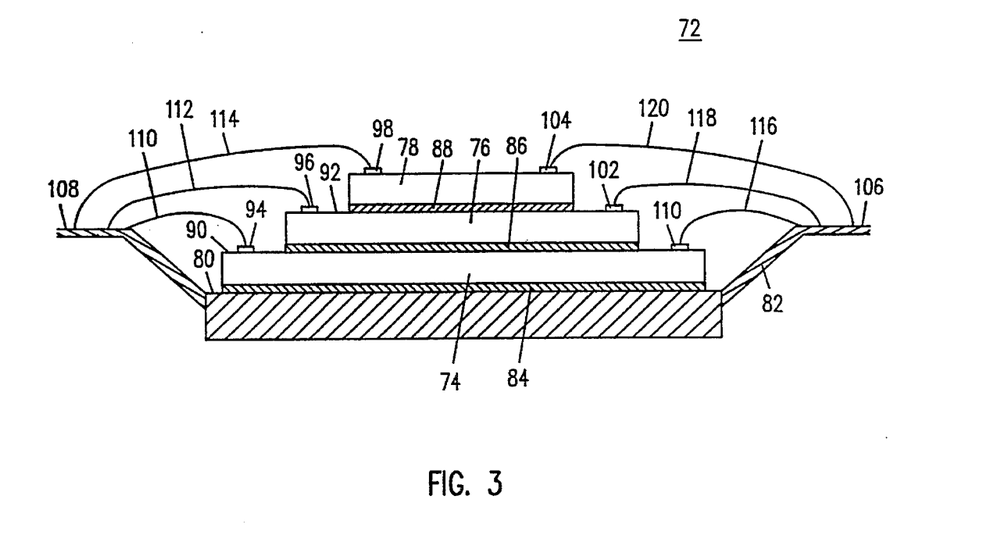
FIG. 3 is a cross-sectional view of an embodiment of a multi-chip module in accordance with the present invention having three elements.

FIG. 3 illustrates another embodiment of the present invention having three stacked elements. The multi-chip module 72 includes three elements 74, 76, and 78 mounted to the principal mounting surface 80 of a carrier member 82. Each of the elements 74, 76, and 78 has planar opposing surfaces and may be either a semiconductor die or a substrate material, provided that at least one of elements 74 or 76 is a semiconductor die. The first element 74 is mounted to the principal mounting surface 80 by way of an adhesive material 84, the second element 76 is mounted to the first element 74 by way of an adhesive material 86, and the third element 78 is mounted to the second element 76 by way of an adhesive material 88. The third element 78 should be at least partially supported by the second element 76, and the second element 76 should be at least partially supported by the first element 74. Furthermore, the second element 76 should be positioned such that the electrical contacts 94 and 100 of the first element 74 are exposed and accessible for making fine wire connections thereto. Likewise, the third element 78 may be positioned such that the electrical contacts 96 and 102 of the second element 76 are exposed and accessible for making fine wire connections thereto. Although the elements 76 and 78 are progressively smaller in size, this is not required, provided the elements are positioned such that at least one of the electrical contacts of the lower element is exposed.

Wire bonding may be used to electrically couple any or all of the contacts 94, 96, 98, 100, 102, and 104 to either or both of the electrical leads 106 and 108. As shown in FIG. 3, fine wire conductors 110, 112, and 114 couple the contacts 94, 96, and 98 to lead 108, and fine wire conductors 116, 118, and 120 couple the contacts 100, 102, and 104 to lead 106.

Figure 4:
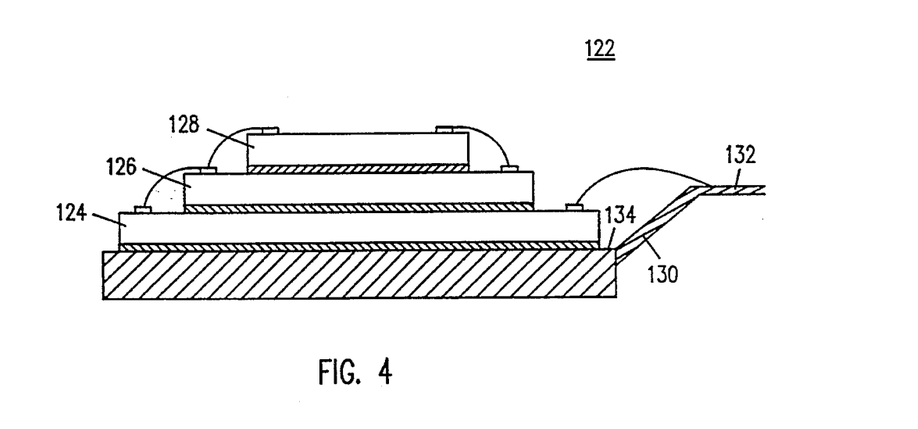
FIG. 4 is a cross-sectional view of an alternative embodiment of a multi-chip module in accordance with the present invention having three element.
Figure 5:
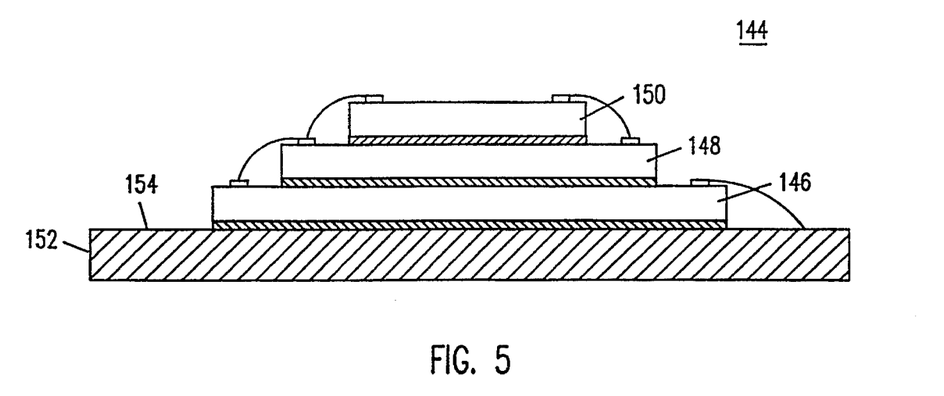
FIG. 5 is a cross-sectional view of a second alternative embodiment of a multi-chip module in accordance with the present invention having three elements.
Figure 6:
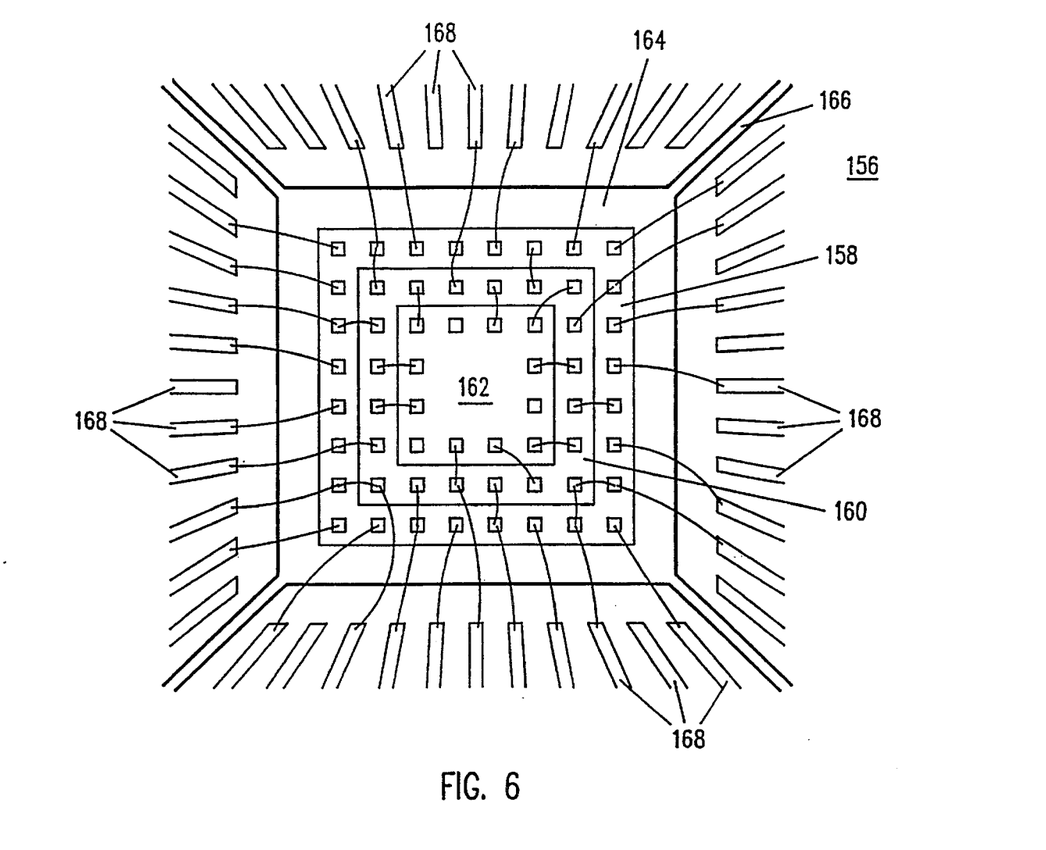
FIG. 6 is a top view of a third alternative embodiment of a multi-chip module in accordance with the present invention having three elements.

The carrier member 82 may be any of the three conventional semiconductor packages discussed above. For example, the multi-chip module 122 shown in FIG. 4 includes three elements 124, 126, and 128 mounted on a carrier member 130 which has electrical leads 132 on only one side of the principal mounting surface 134. The multi-chip module 144 shown in FIG. 5 includes three elements 146, 148, and 150 mounted on a carrier member 152. The carrier member 152 is either a ceramic package or a metal can having electrical leads (not shown) mounted directly below the principal mounting surface 154. FIG. 6 is a top view of a multi-chip module 156 having three elements 158, 160, and 162 mounted on the principal mounting surface 164 of a carrier member 166. The carrier member 166 includes electrical leads 168 on all four sides of the carrier member 166.

Figure 7:
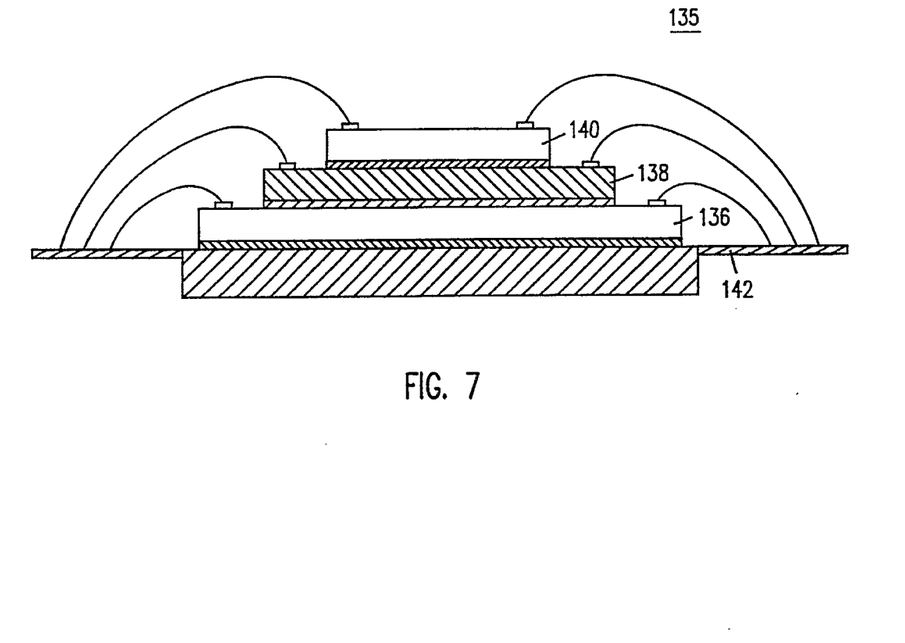
FIG. 7 is a cross-sectional view of a fourth alternative embodiment of a multi-chip module in accordance with the present invention having three element.

Any combination of the three elements may be either semiconductor dice and/or a substrate material, provided that the uppermost element is not the only die. Again, the choice of die or substrate, as well as the particular wire bonding interconnections to be made, depends upon the particular application for which the multi-chip module is to be used. FIG. 7 illustrates a multi-chip module 135 having three elements 136, 138, and 140 mounted on a carrier member 142. The first and third elements 136 and 140 are semiconductor dice, and the second element 138 is a substrate material.

Figure 8:
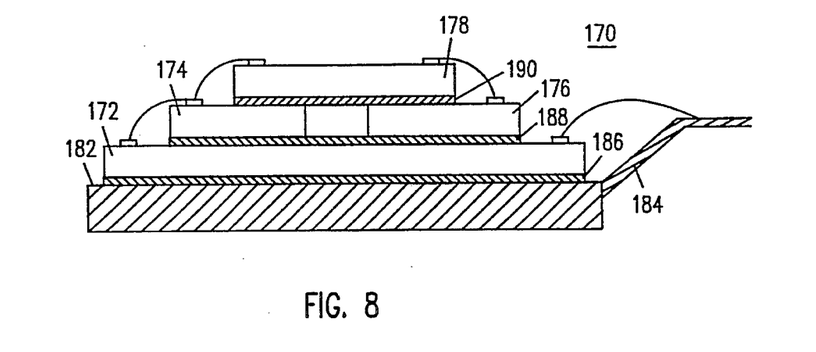
FIG. 8 is a cross-sectional view of an embodiment of a multi-chip module in accordance with the present invention having four elements.
Figure 9:
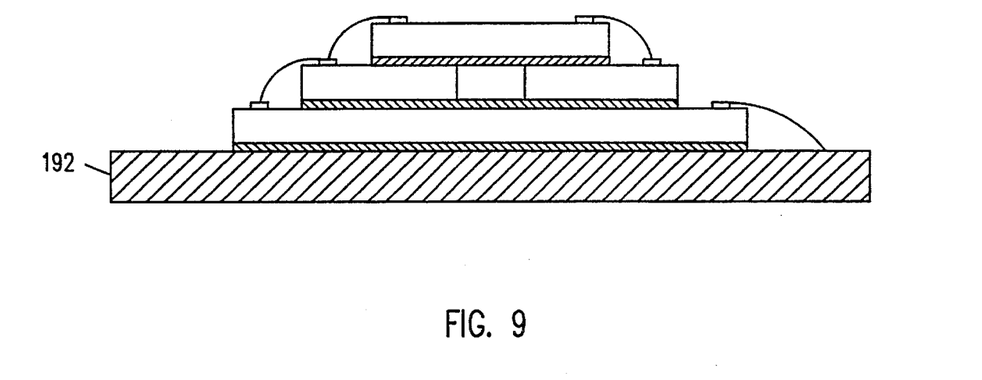
FIG. 9 is a cross-sectional view of a first alternative embodiment of a multi-chip module in accordance with the present invention having four element.

FIG. 8 illustrates another embodiment of a multi-chip module 170 in accordance with the present invention. Four elements 172, 174, 176, and 180 are mounted on the principal mounting surface 182 of a carrier member 184. Each of the elements 172, 174, 176, and 178 has planar opposing surfaces and may be either a semiconductor die or a substrate material, provided that at least one of the elements 172, 174, or 176 is a die. The second and third elements 174 and 176 are both supported by the first element 172. The fourth element 178 is partially supported by the second element 174 and partially supported by the third element 176. Furthermore, elements 174 and 176 are positioned such that at least one of the electrical contacts of element 172 is exposed for wire bonding, and element 178 is positioned such that at least one of the electrical contacts of either element 174 or 176 is exposed for wire bonding. Adhesive materials 186, 188, and 190 are used to mount each of the elements 172, 174, 176, and 180 to the carrier 184. Again, the carrier member 184 may be the carrier of any type of conventional semiconductor package. FIG. 9 illustrates basically the same embodiment shown in FIG. 8, except that the carrier member 192 is the type found in a ceramic package or a metal can.

Figure 10:
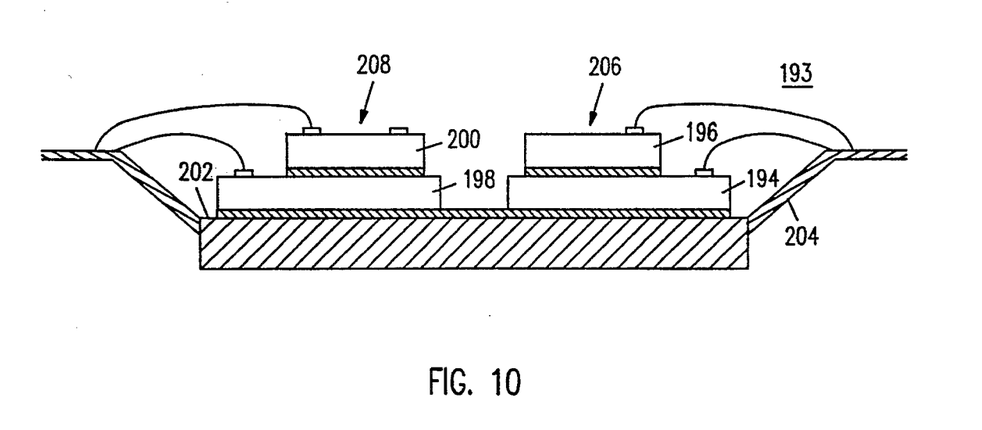
FIG. 10 is a cross-sectional view of a second alternative embodiment of a multi-chip module in accordance with the present invention having four elements.

FIG. 10 illustrates another embodiment of a multi-chip module 193 in accordance with the present invention. Four elements 194, 196, 198, and 200 are mounted on the principal mounting surface 202 of a carrier member 204. Each of the elements 194, 196, 98, and 200 has planar opposing surfaces. The elements 194 and 198 are semiconductor die, and the elements 196 and 200 may each be either a semiconductor die or a substrate material. The four elements 194, 196, 198, and 200 are arranged in two separate stacks 206 and 208. The first stack 206 includes the first element 194 mounted on the principal mounting surface 202 and the second element 196 being at least partially supported by the first element 194. The second stack 208 includes the third element 198 mounted on the principal mounting surface 202 and the fourth element 200 being at least partially supported by the third element 198.

Figure 11:
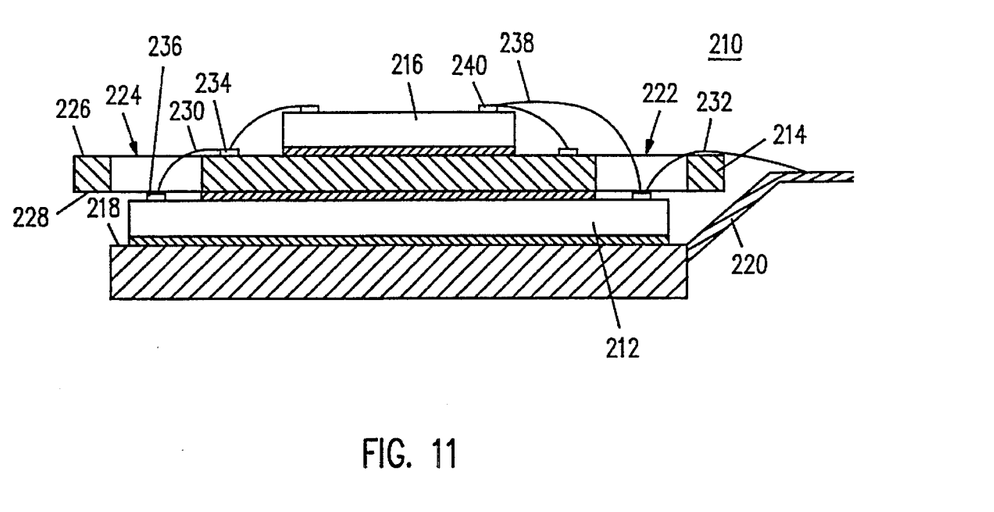
FIG. 11 is a cross-sectional view of an embodiment of a multi-chip module in accordance with the present invention having three elements with one of the elements having at least one hole or slot therethrough.

FIG. 11 illustrates another embodiment of a multi-chip module 210 in accordance with the present invention. Three elements 212, 214, and 216 are mounted on the principal mounting surface 218 of a carrier member 220. Each of the elements 212, 214, and 216 has planar opposing surfaces and may be either a semiconductor die or a substrate material, provided that at least one of elements 214 or 216 is a die. The first element 212 is mounted on the principal mounting surface 218, the second element 214 is at least partially supported by the first element 212, and the third element 216 is at least partially supported by the second element 214. The principal difference between the multi-chip module 210 and the other embodiments discussed above is that the second element 214 has holes (or slots) 222 and 224 extending through the second element 214 from the first surface 226 to the second surface 228.

The purpose of the holes 222 and 224 is to expose and make accessible the electrical contacts 236 and 242 of the element 212 for making fine wire connections thereto. In other words, element 214 is positioned in such a manner that the electrical contacts 236 and 242 are exposed and accessible through the holes 22 and 224. By using holes 22 and 224 to expose the electrical contacts 236 and 242, wire bonding interconnections can be made between the elements 216, 214, and 212 even if element 214 is larger than element 212. For example, fine wire conductor 230 extends from electrical contact 234 through the hole 224 and makes contact with electrical contact 236. As another example, fine wire conductor 238 extends from electrical contact 240 through the hole 222 and makes contact with electrical contact 242. Thus, if the second element 214 is larger than the first element 212 such that it is completely covered by the second element 214, the holes 222 and 224 permit a direct electrical connection to be made via a fine wire conductor between the first element 212 and the third element 216.

One reason that the second element 214 would be larger than the first element 212 is to permit the first surface 226 to accommodate a large amount of circuitry for making many interconnectoins between the first and second elements 212 and 216. Normally, the second element 214 will be a substrate material for use as an interconnect media. However, the second element 214 could also be a semiconductor die having holes on portions of the die where there is no circuitry.

Figure 12:
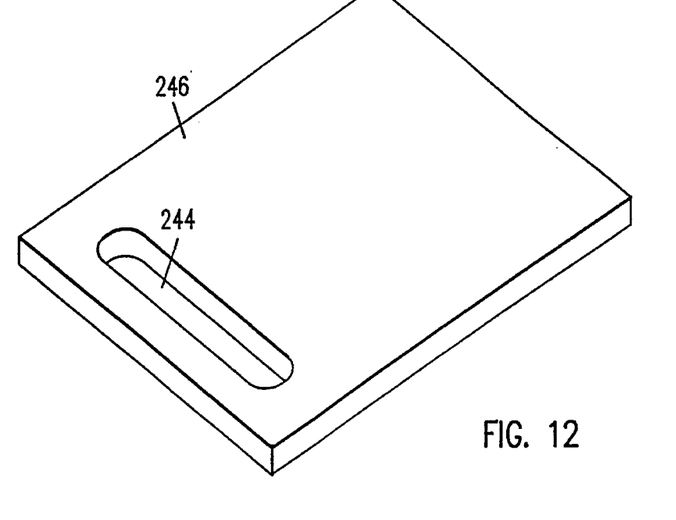
FIG. 12 is an isometric view of an element having a hole or slot therethrough.

FIG. 12 illustrates one manner in which a hole or slot 244 may be formed through an element having parallel opposing surfaces. The hole 244 may be any desired size or shape; for example, the hole 244 may be a small round hole, a long rectangular hole, a square hole, etc.

Figure 13:
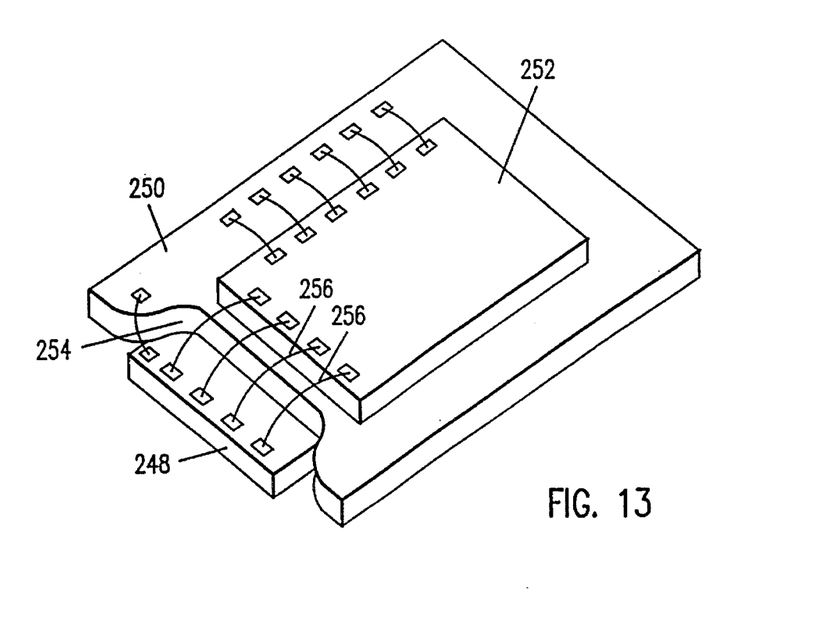
FIG. 13 is an isometric view of three elements wherein one of the has a cut-away section.

FIG. 13 illustrates a second element 250 which is sandwiched between a first element 248 and a third element 252. Instead of using a hole or slot, the second element 250 has a cut-away portion 254 which permits the fine wire conductors 256 to extend from the third element 252 to the first element 248. Thus, a cut-away portion in any one of the elements may serve a similar purpose of a hole or slot.

Figure 14:
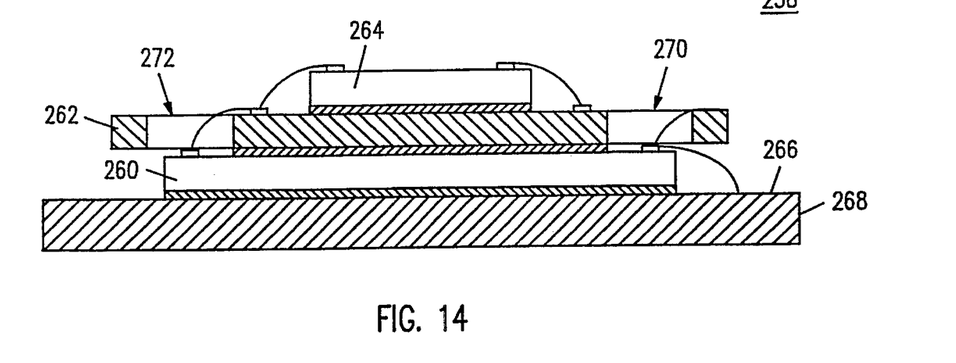
FIG. 14 is a cross-sectional view of an alternative embodiment of a multi-chip module in accordance with the present invention having three elements with one of the elements having at least one hole or slot therethrough.
Figure 15:
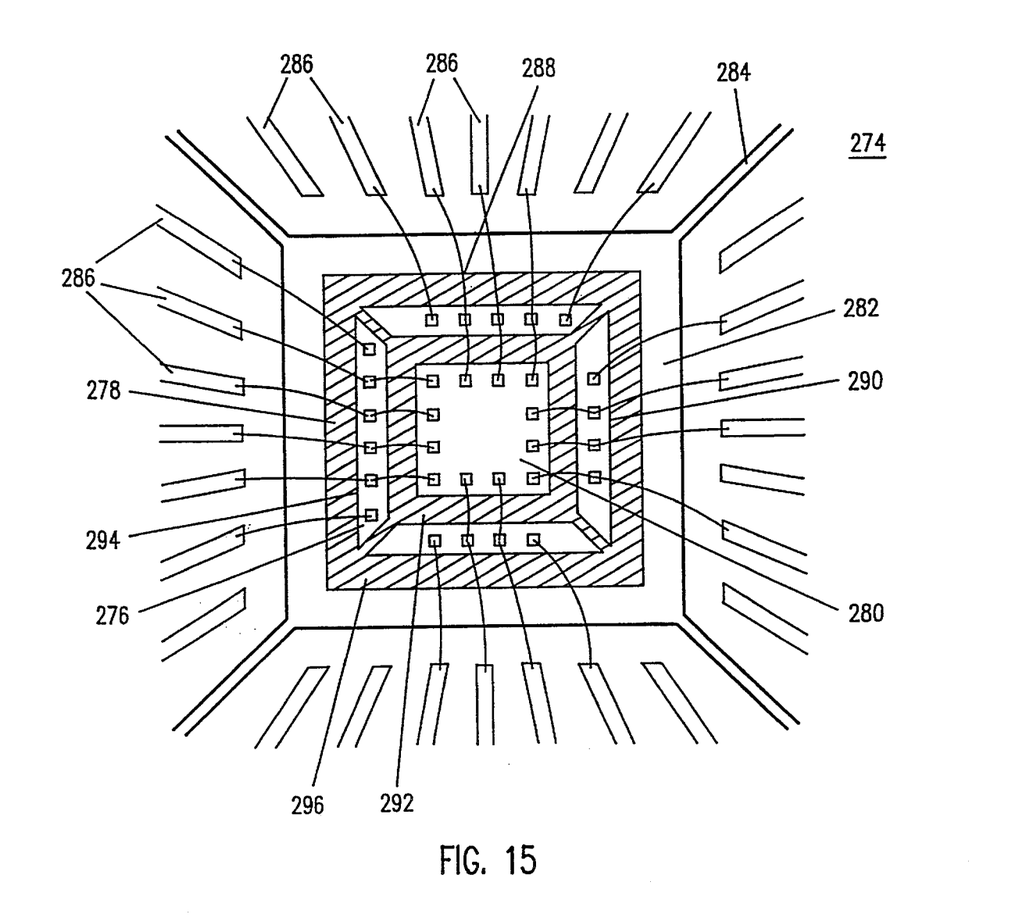
FIG. 15 is a top view of a second alternative embodiment of a multi-chip module in accordance with the present invention having three elements with one of the elements having at least one hole or slot therethrough.

FIG. 14 illustrates a multi-chip module 258 having three elements 260, 262, and 264 mounted on the principal mounting surface 266 of a carrier member 268. The second element 262 includes holes 270 and 272. The carrier member 268 is of the type found in a ceramic package or metal can. FIG. 15 is a top view of a multi-chip module 274 having three elements 276, 278, and 280 mounted on the principal .ounting surface 282 of a carrier member 284. The carrier member 284 is of a type having electrical leads 286 on all four sides of the principal mounting surface 282. The second element 278 includes four slots 288, 290, 292, and 294 extending therethrough to expose the electrical contacts of the first element 276. Thus, fine wire conductor 296 is permitted to extend from the third element 276.

Referring back to FIG. 1, a method of manufacturing the multi-chip module 20 begins with applying an adhesive or soft-solder 48 on the principal mounting surface 40 of the carrier member 42. A semiconductor die 22 is then dispensed onto the adhesive 48 with a pressure of about 8–10 poundds per square-inch (psi).

The next step is to apply an adhesive or epoxy 50 onto the first surface 30 of the die 22. A first element 24 is then dispensed onto the adhesive 50 with a pressure of about 3–5 psi. The first element 24 should be at least partially supported by the die 22, and furthermore, the first element 24 should be positioned such that at least one of the electrical contacts of the die 22 is exposed and accessible for making wire bonding connections thereto. The first element 24 may be semiconductor die or a substrate material.

If a second element is desired, an adhesive or epoxy is applied to the first surface 36 of the first element 24 and a second element is dispensed onto the first surface 36. If additional elements are desired, the same steps of applying an adhesive or epoxy onto the surface of the last dispensed element and then dispensing another element onto the last element are followed.

After the desired number of elements are mounted on the carrier 42, then the electrical contacts on the elements, such as contacts 32, 38, 54, and 58, and the electrical leads on the carrier 42, such as leads 44 and 46, are wire bonded together.

After the wire bonding is complete, the carrier member 42 is sealed in the semiconductor package 26. This step usually entails forming the mold compound 25 around the carrier 42 such that the die and first element 22 and 24 are completely covered with mold compound 25 and only the leads 44 and 46 are exposed. While the semiconductor package 26 is a DIP, it should be understood that any conventional semiconductor package may be used.

An alternative method of manufacturing the multi-chip module 20 begins with pre-assembling the stacked die and first element 22 and 24, and then mounting the pre-assembled stack onto the carrier member 42. In other words, the desired number of elements, whether it be two, three, four, etc., are first stacked and bonded together with adhesive. The stack is then mounted on the principal mounting surface 40. After wire bonding interconnections are made, the circuit assembly is sealed in the semiconductor package. This alterative method has the advantage that all of the dice are mounted on the carrier member in a single step rather than each separate die being mounted on the carrier member one at a time.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A circuit assembly, comprising:

a first semiconductor die having substantially parallel opposing first and second surfaces and at least one electrical contact disposed at the first semiconductor die first surface;

a second semiconductor die having substantially parallel opposing first and second surfaces and at least one electrical contact disposed at the second semiconductor die first surface, the second semiconductor die being mounted on and at least partially supported at its second surface by the first semiconductor die first surface, the second semiconductor die having a hole extending therethrough from the second semiconductor die first surface to the second semiconductor die second surface to expose the first semiconductor die electrical contact; and a fine wire conductor having first and second ends, the first end extending through the hole in the second semiconductor die and being connected to the first semiconductor die electrical contact.

2. The circuit assembly of claim 1, wherein the second end of the fine wire conductor is connected to the second semiconductor die electrical contact.

3. The circuit assembly of claim 1, further comprising:

a carrier member having a principal mounting surface and a plurality of electrical leads, wherein the first semiconductor die is mounted on and at least partially supported at its second surface by the principal mounting surface.

4. The circuit assembly of claim 3, wherein the second end of the fine wire conductor is connected to one of the plurality of electrical leads.

\* \* \* \* \*